United States Patent
Tryon et al.

(10) Patent No.: US 10,859,267 B2
(45) Date of Patent: Dec. 8, 2020

(54) OXIDATION RESISTANT THERMAL BARRIER COATING SYSTEM FOR COMBUSTOR PANELS

(71) Applicant: United Technologies Corporation, Farmington, CT (US)

(72) Inventors: Brian S. Tryon, Los Gatos, CA (US); Alexander W. Williams, Windsor Locks, CT (US); Stephen K. Kramer, Cromwell, CT (US); Kevin W. Schlichting, South Glastonbury, CT (US); Jessica L. Serra, East Hartford, CT (US)

(73) Assignee: RAYTHEON TECHNOLOGIES CORPORATION, Farmington, CT (US)

(*) Notice: Subject to any disclaimer, the term of this patent is extended or adjusted under 35 U.S.C. 154(b) by 589 days.

(21) Appl. No.: 15/106,070

(22) PCT Filed: Dec. 12, 2014

(86) PCT No.: PCT/US2014/070045
§ 371 (c)(1),
(2) Date: Jun. 17, 2016

(87) PCT Pub. No.: WO2015/094975
PCT Pub. Date: Jun. 25, 2015

(65) Prior Publication Data
US 2016/0341426 A1 Nov. 24, 2016

Related U.S. Application Data

(60) Provisional application No. 61/917,761, filed on Dec. 18, 2013.

(51) Int. Cl.
*F23R 3/00* (2006.01)
*F01D 5/28* (2006.01)
(Continued)

(52) U.S. Cl.
CPC ............... *F23R 3/002* (2013.01); *C23C 4/06* (2013.01); *C23C 4/134* (2016.01); *C23C 14/325* (2013.01);
(Continued)

(58) Field of Classification Search
CPC .......... F23R 3/007; F23R 3/002; F01D 5/288; F01D 2300/21; C23C 4/06; C23C 4/134; C23C 14/325; F05D 2300/21
See application file for complete search history.

(56) References Cited

U.S. PATENT DOCUMENTS 6,136,453 A 10/2000 Ritter et al.
6,955,308 B2 * 10/2005 Segrest .................... B08B 3/02
241/1

(Continued)

FOREIGN PATENT DOCUMENTS

EP 1837412 A2 9/2007

OTHER PUBLICATIONS

International Search Report; PCT/US2014/07045; dated Mar. 2, 2015; 2 Pages.

(Continued)

*Primary Examiner* — Carlos A Rivera
(74) *Attorney, Agent, or Firm* — Cantor Colburn LLP

(57) ABSTRACT

An oxidation resistant coating system for a turbine engine component includes a cathodic arc coating applied to a surface of the engine component, a thin APS metallic coating applied to a surface of the cathodic arc coating, and a ceramic top coating applied to a surface of the thin APS metallic coating to improve lifetime of the engine components.

20 Claims, 3 Drawing Sheets

(51) Int. Cl.
*C23C 4/134* (2016.01)
*C23C 4/06* (2016.01)
*C23C 14/32* (2006.01)

(52) U.S. Cl.
CPC .............. *F01D 5/288* (2013.01); *F23R 3/007* (2013.01); *F05D 2300/21* (2013.01); *Y02T 50/672* (2013.01)

(56) References Cited

U.S. PATENT DOCUMENTS

| | | | |
|---|---|---|---|
| 8,497,028 | B1 | 7/2013 | Tryon et al. |
| 2008/0113163 | A1 | 5/2008 | Schlichting et al. |
| 2011/0151219 | A1* | 6/2011 | Nagaraj .................. F23R 3/007 428/215 |
| 2011/0256421 | A1* | 10/2011 | Bose ...................... B32B 15/01 428/680 |
| 2012/0114912 | A1* | 5/2012 | Bunker .................... C23C 4/18 428/173 |
| 2012/0148769 | A1* | 6/2012 | Bunker .................. B23P 15/04 428/34.1 |
| 2012/0163984 | A1* | 6/2012 | Bunker .................... F01D 5/187 416/241 B |
| 2012/0164473 | A1* | 6/2012 | Taylor ..................... C23C 10/10 428/623 |
| 2012/0243995 | A1* | 9/2012 | Bunker ..................... F01D 5/18 416/95 |
| 2013/0157078 | A1* | 6/2013 | Onal ...................... C23C 28/3215 428/650 |
| 2016/0032737 | A1* | 2/2016 | Strock ...................... F01D 5/288 415/1 |

OTHER PUBLICATIONS

Written Opinion of the International Searching Authority; PCT/US2014/07045; dated Mar. 2, 2015; 7 Pages.
European Search Report for European Application No. 14872253.1, dated Aug. 9, 2017, 6 pages.
Gill et al., Plasama Spray Coating Processes, Materials Science and Technology (1986), 207-213.
Lindfors et al., Carthodic Arc Deposition Technology, Surface and Coatings Technology, 29 (1986) 275-290.

* cited by examiner

Fig. 1 - Prior Art -

OXIDATION RESISTANT THERMAL BARRIER COATING SYSTEM FOR COMBUSTOR PANELS

CROSS-REFERENCE TO RELATED APPLICATIONS

This application is a National Phase Application of Patent Application PCT/US2014/070045 filed on Dec. 12, 2014, which claims the benefit of and priority to U.S. Provisional Patent Application No. 61/917,761 filed on Dec. 18, 2013 and titled Oxidation Resistant Thermal Barrier Coating System for Combustor Panels, the contents each of which are incorporated herein by reference in its their entirety.

FIELD OF USE

The present disclosure relates to coatings, and more particularly, to a coating system applied to combustor panels of the gas turbines or jet engines, processes for applying same, and a coated article.

BACKGROUND

Components of the gas turbine engine include combustor panels that function in one of the harshest engine environments. Combustor panels are generally made of metals such as superalloys with thermal barrier coating (TBC) applied to the metal.

However, in service, the structure and composition of the various layers degrade due to one or more of the sintering of the ceramic layer, oxidation of the bond coat, and interdiffusion phenomena with the substrate. As a result, the properties of each layer are affected as is the interfacial toughness. These degradations, combined with applied external stresses, may lead to bond coat rumpling, oxidation of the bond coat, crack formation at the bond coat/ceramic interface, and spall-off of the ceramic layer.

These aging phenomena occurring in the thermal barrier coatings at high temperature accelerate oxidation and degradation of the TBC system, which reduces the lifetime of components.

Accordingly, it is highly desirable to provide an oxidation resistant coating system for components of the gas turbine engine like combustor panels.

SUMMARY

The present disclosure relates to coatings, and more particularly, to a coating system applied to combustor panels of the gas turbines or jet engines, processes for applying same, and a coated article.

In accordance with one exemplary embodiment of the present disclosure, a coating system for an article includes a first oxidation resistant metallic coating applied to a surface of the article, wherein the first metallic coating is formed by cathodic arc deposition. The coating system further includes a second metallic coating applied to at least a portion of the first metallic coating, wherein the second metallic coating is applied by air plasma spray (APS), and a ceramic top coating applied to at least a portion of the second metallic coating.

In accordance with another exemplary embodiment of the present disclosure, a coated article includes an article having at least one surface, a first metallic coating applied to the surface of the article by cathodic arc deposition, and a second metallic coating applied to a surface of the first metallic coating, and formed by an air plasma spray (APS0. The coated article further includes a ceramic top coating applied to a surface of the second metallic coating, wherein the second metallic coating is of a similar metallic composition to the first metallic coating.

In accordance with yet another exemplary embodiment of the present disclosure, a process for forming an oxidation resistant coating on an article includes providing a metal substrate and forming an oxidation resistant coating on a surface of the metal substrate by cathodic arc deposition. The process further includes forming a metallic coating on a surface of the cathodic arc deposited coating by an air plasma spray (APS0 and forming a ceramic top coating on a surface of the metallic coating, wherein the metallic coating is of a similar metallic composition to the oxidation resistant coating.

The combustor panels with issues that limit the life of parts, for example, burn-back, TBC spallation, or burn-through, will benefit from superior and economical ways of increasing their environmental resistance according to the present disclosure.

The details of one or more embodiments of the present disclosure are set forth in the accompanying drawings and the description below. The features and advantages described in the specification are not all inclusive, and other features, objects, and advantages of the present disclosure will be apparent from the description and drawings, and from the claims.

Like reference numbers and designations in the various drawings indicate like elements. The drawings depict various preferred embodiments of the present disclosure for purposes of illustration only. One skilled in the art will readily recognize from the following discussion that alternative embodiments of the structures and methods illustrated herein may be employed without departing from the principles of the disclosure described herein.

DETAILED DESCRIPTION

The present disclosure relates to coatings, and more particularly, to a coating system applied to combustor panels of the gas turbines or jet engines, processes for applying same, and a coated article.

Thermal barrier coating systems are advanced material systems usually applied to the metallic surface, such as gas turbine or aero-engine parts, operating at elevated temperatures as a form of exhaust heat management. These coatings are designed to serve to insulate components from large and prolonged heat loads by utilizing thermally insulating materials which can sustain an appreciable temperature difference between the load-bearing alloys and the coating surface. In doing so, these coatings can allow for higher operating temperatures while limiting the thermal exposure of structural components, extending part life by reducing oxidation and thermal fatigue.

Figure 1:
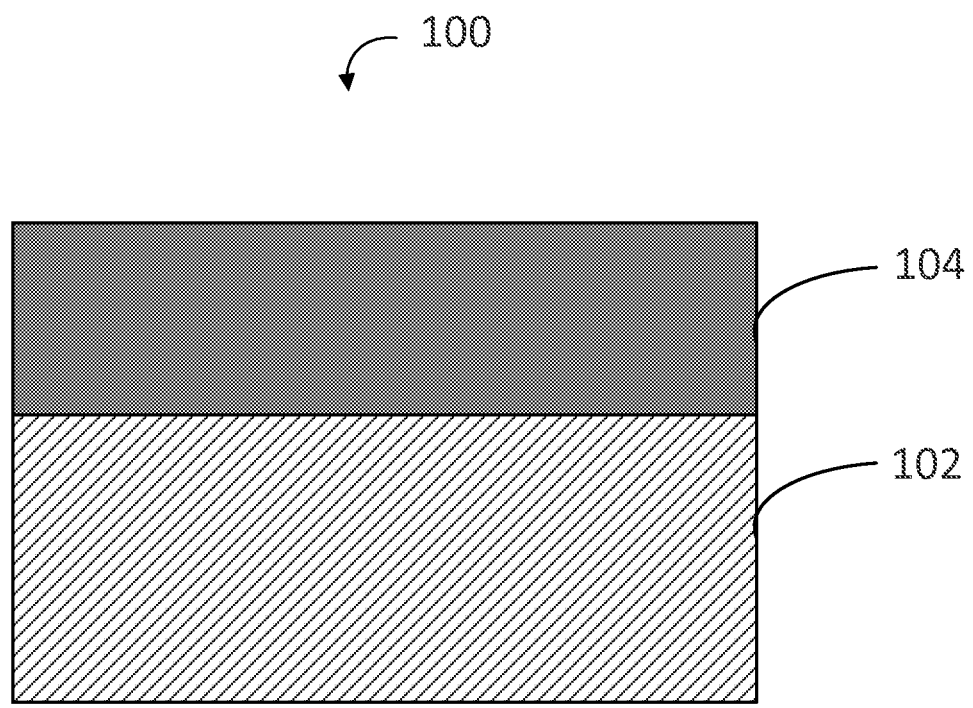
FIG. 1 is a schematic illustration of a coated article made in accordance with the prior art.

FIG. 1 is a schematic illustration of a coated article 100 made in accordance with the conventional art. The coated article 100 includes a metal substrate 102 such as a combustor panel of the turbine engine which is typically made of a superalloy material. The coated article 100 further includes a thermal barrier coating (TBC) 104 formed on the metal substrate 102.

Typically, a TBC includes metallic bond coat and ceramic top coat. The ceramic topcoat is typically composed of a stabilized zirconia, such as yttria stabilized zirconia (YSZ) which is desirable for having low conductivity while remaining stable at nominal operating temperatures typically seen in gas turbine applications.

Thermal barrier coatings (TBCs) are used to protect, for example, blades, vanes, and combustor panels in the hot sections of the gas turbines. Especially in gas turbines and jet engines, the turbine blades typically include TBCs. They consist of a ceramic layer deposited on an alumina forming metallic bond coat in contact with the nickel-based superalloy substrate. They are designed to prolong the components lifetimes or to enable increases gas temperature, or both.

The above-mentioned thermal barrier coatings may be porous, and thus do not have high resistance to oxidation at high temperature. What is desirable is to form another coating layer that is more highly resistant to oxidation at high temperature to improve lifetime of the combustor panels.

Figure 2:
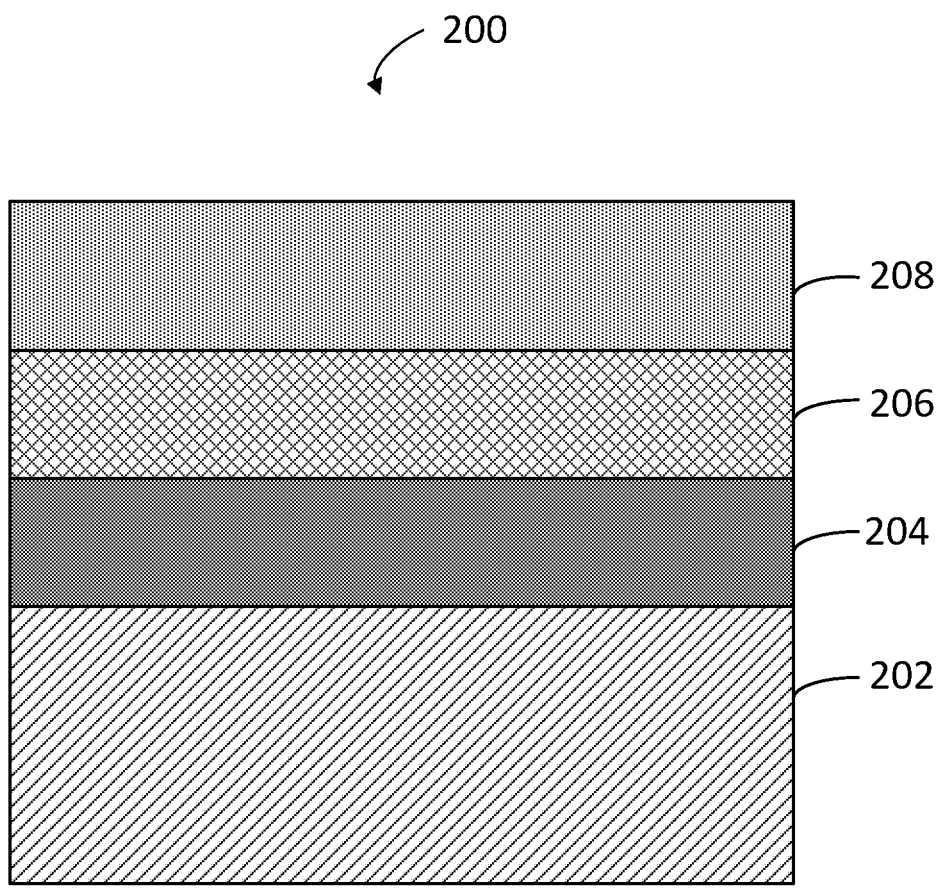
FIG. 2 is a schematic illustration of a coated article made in accordance with present disclosure.

The present disclosure relates to an improved TBC coating system for a turbine engine component such as combustor panels or liners. FIG. 2 is a schematic illustration of a coated article 200 in accordance with one exemplary embodiment of the present disclosure. According to an aspect of the present disclosure, a metal substrate 202 which constitutes a turbine engine component is made of a superalloy material such as nickel-based super alloy. Applied to a surface of the metal substrate 202 are cathodic arc coating 204 and APS metallic coating formed on the cathodic arc coating by a known air plasma spray (APS) technique.

The cathodic arc coating 204 is a metallic coating having a high oxidation resistance. Since the cathodic arc deposition is carried out in a vacuum at a relatively low temperature, the resulting coating layer has a smooth surface and the underlying metal substrate is not much affected by the process temperature. In one embodiment, the composition of the cathodic arc coating includes nickel (Ni), but the composition of the cathodic arc coating is not limited to nickel, but can include other metallic material like chromium or an alloy of nickel and other metallic materials including chromium.

The cathodic arc deposition is a known physical vapor deposition technique in which an electric arc is used to vaporize material from a cathode target. The vaporized material then condenses on a substrate, forming a thin film. Generally, the technique can be used to deposit metallic, ceramic, and composite films.

Typically, the arc evaporation process begins with the striking of a high current, low voltage arc on the surface of a cathode or target that gives rise to a small, highly energetic emitting area known as a cathode spot. The localized temperature at the cathode spot is extremely high, which results in a high velocity jet of vaporized cathode material, leaving a crater behind on the cathode surface. The cathode spot is only active for a short period of time, then it self-extinguishes and re-ignites in a new area close to the previous crater. This behavior causes the apparent motion of the arc.

As the arc is basically a current carrying conductor, it can be influenced by the application of an electromagnetic field, which in practice is used to rapidly move the arc over the entire surface of the target, so that the total surface is eroded over time. The arc has an extremely high power density resulting in a high level of ionization, multiple charged ions, neutral particles, and macro-particles (droplets).

Referring to FIG. 2, a thin APS metallic coating 206 is then applied to at least a portion of the surface of the cathodic arc coating 204. The APS metallic layer 206 may be, but is not required to be, of a similar metallic composition to the cathodic arc coating. The surface of the APS metallic layer 206 has a certain degree of roughness, a roughness greater than that of the cat arc deposited material, and provides mechanical interlocking for the ceramic top coating 208. The ceramic top coating 208 may then be applied by the APS technique, or other suitable process, to at least a portion of the surface of the APS metallic layer 206. In one embodiment, the composition of the APS metallic layer includes nickel (Ni), but the composition of the APS metallic layer is not limited to nickel, but can include other metallic material like chromium or an alloy of nickel and other metallic materials including chromium.

The APS technique uses plasma as the source of energy for thermal spraying. Typically, APS uses a high-temperature plasma jet generated by arc discharge, which makes it possible to spray refractory materials such as oxides, molybdenum, etc. In plasma spraying process, the material to be deposited, typically as a powder, is introduced into the plasma jet, emanating from a plasma torch. In the jet, where the temperature is on the order of 10,000K, the material is melted and propelled towards a substrate. There, the molten droplets form a deposit, and the deposits remain adherent to the substrate as coatings. Resulting coatings are made by the accumulation of numerous sprayed particles.

The cathodic arc coating 204 and the APS metallic coating 206 as applied to a surface of combustor panels have been shown via burner rig, a test designed to evaluate the durability of TBC, to provide about 20 times oxidation life improvement over the conventional TBC coating system currently applied to the panels. Application via cathodic arc coating affords the panels the opportunity to be coated at low and even temperatures which prevent warping or potato-chipping of the thin walled panels. Therefore, application of the coating system described above to the combustor panels dramatically increases lifetime of the combustor panels.

Figure 3:
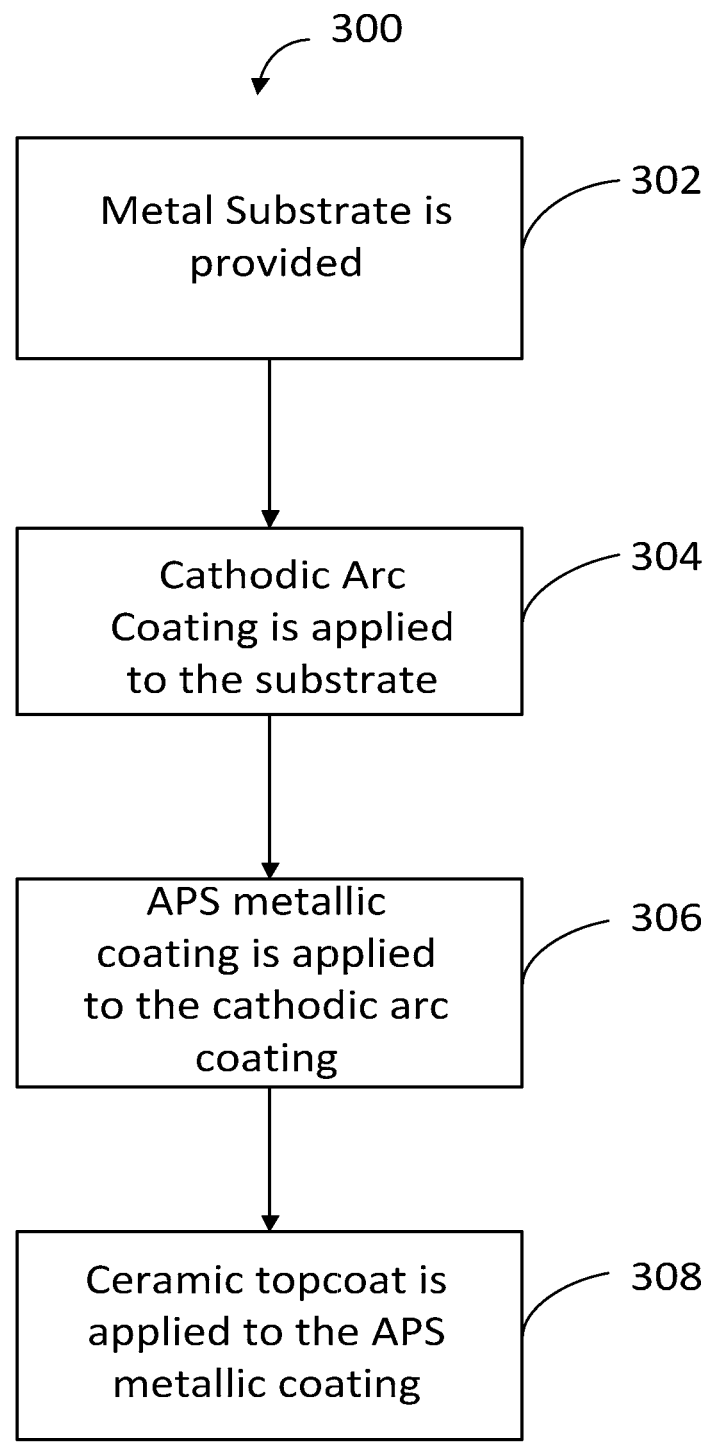
FIG. 3 is a flow chart of a coating process of the present disclosure.

FIG. 3 is a flow chart of a coating process 300 of the present disclosure. Referring to FIG. 3, a metal substrate is provided at step 302. The metal substrate may include combustor panels, blades, vanes or outer air seals of the gas turbine engine. Then, a cathodic arc coating is applied to a surface of the substrate at step 304, followed by a thin metallic APS coating applied to a surface of the cathodic arc coating at step 306.

A thin metallic layer may be applied using an application process such as, but not limited to, plasma spraying processes (e.g., APS, LPPS, etc.). According to one exemplary embodiment of the present disclosure, a thin metallic layer is applied to the surface of the cathodic arc coating at step 306 using an air plasma spray (APS), as known to one of ordinary skill in the art. Then, a ceramic top coating is applied on the thin APS metallic coating at step 308. Suitable application processes may be utilized as known to one of ordinary skill in the art.

It is to be understood that the disclosure of the present disclosure is not limited to the illustrations described and shown herein, which are deemed to be merely illustrative of the best modes of carrying out the disclosure, and which are susceptible to modification of form, size, arrangement of parts, and details of operation. The disclosure of the present disclosure rather is intended to encompass all such modifications which are within its spirit and scope of the disclosure as defined by the following claims.

What is claimed is:

1. A coating system for an article, comprising:
   a first oxidation resistant metallic coating applied to a surface of the article, wherein the first metallic coating is in continuous contact with the contiguous surface of the article, is formed by cathodic arc deposition in a vacuum, and the first metallic coating has a surface;
   a second metallic coating applied to the whole surface of the first metallic coating, wherein the second metallic coating is applied by air plasma spray (APS) and the second metallic coating has a surface; and
   a ceramic top coating applied to the surface of the second metallic coating.

2. The coating system of claim 1, wherein said article includes a combustor panel of a gas turbine engine.

3. The coating system of claim 1, wherein the composition of the first metallic coating includes nickel, chromium, or an alloy of nickel and chromium.

4. The coating system of claim 1, wherein the composition of the second metallic coating includes nickel, chromium, or an alloy of nickel and chromium.

5. The coating system of claim 1, wherein the first metallic coating has the same composition as that of the second metallic coating.

6. The coating system of claim 1, wherein the surface of the second metallic coating has a higher surface roughness than the surface of the first metallic coating and provides a mechanical interlocking between the second metallic coating and the ceramic top coating.

7. The coating system of claim 1, wherein the ceramic top coating is formed by an air plasma spray (APS).

8. A coated article, comprising:
   an article having at least one surface;
   a first metallic coating in continuous contact with the contiguous surface of the article and applied to the surface of the article by cathodic arc deposition in a vacuum;
   a second metallic coating applied to the whole surface of the first metallic coating, and formed by an air plasma spray (APS); and
   a ceramic top coating applied to the whole surface of the second metallic coating, wherein the second metallic coating is of a similar metallic composition to the first metallic coating.

9. The coated article of claim 8, wherein said article includes combustor panels of a gas turbine engine.

10. The coated article of claim 8, wherein a composition of the first metallic coating includes nickel, chromium, or an alloy of nickel and chromium.

11. The coated article of claim 8, wherein a composition of the second metallic coating includes nickel, chromium, or an alloy of nickel and chromium.

12. The coated article of claim 8, wherein the second metallic coating has the same composition as that of the first metallic coating.

13. The coated article of claim 8, wherein the second metallic coating surface has a higher surface roughness than the first metallic coating surface and the second metallic coating surface provides a mechanical interlocking between the APS metallic coating and the ceramic top coating.

14. The coated article of claim 8, wherein the ceramic top coating is formed by an air plasma spray (APS) in an atmospheric pressure.

15. A process for forming an oxidation resistant coating on an article, comprising:
   providing a metal substrate;
   forming an oxidation resistant coating on a surface of the metal substrate by cathodic arc deposition in a vacuum wherein the oxidation resistant coating is in continuous contact with the contiguous surface of the metal substrate;
   forming a metallic coating on the whole surface of the cathodic arc deposited coating by an air plasma spray (APS); and
   forming a ceramic top coating on the whole surface of the metallic coating, wherein the metallic coating is of a similar metallic composition to the oxidation resistant coating.

16. The process of claim 15, wherein a composition of the oxidation resistant coating includes nickel, chromium, or an alloy of nickel and chromium.

17. The process of claim 15, wherein a composition of the metallic coating includes nickel, chromium, or an alloy of nickel and chromium.

18. The process of claim 15, wherein said article includes combustor panels of a gas turbine engine.

19. The processes of claim 15, wherein the oxidation resistant coating has the same composition as that of the metallic coating.

20. The process of claim 15, wherein the ceramic top coating is formed by an air plasma spray (APS) in an atmospheric pressure.

* * * * *